United States Patent
Wang et al.

(10) Patent No.: US 10,659,077 B2
(45) Date of Patent: May 19, 2020

(54) AMENDING CIRCUIT OF CORRECTING BOUNCING MISJUDGMENT OF A KEYSWITCH

(71) Applicant: PixArt Imaging Inc., Hsin-Chu (TW)

(72) Inventors: Tsung-Fa Wang, Hsin-Chu (TW); Shih-Wei Kuo, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 0 days.

(21) Appl. No.: 15/597,110

(22) Filed: May 16, 2017

(65) Prior Publication Data
US 2018/0212620 A1    Jul. 26, 2018

(30) Foreign Application Priority Data
Jan. 25, 2017 (TW) .............................. 106102767 A

(51) Int. Cl.
| H03M 11/20 | (2006.01) |
| H03K 5/1254 | (2006.01) |
| H03M 11/00 | (2006.01) |

(52) U.S. Cl.
CPC .......... *H03M 11/20* (2013.01); *H03K 5/1254* (2013.01); *H03M 11/00* (2013.01)

(58) Field of Classification Search
CPC ....... H03M 11/00; H03M 11/20; G06F 3/023; H03K 5/1254
See application file for complete search history.

(56) References Cited

U.S. PATENT DOCUMENTS

| 3,651,463 A * | 3/1972 | Rawson | H03M 11/20 178/17 R |
| 5,115,705 A * | 5/1992 | Monte | G10H 1/182 338/69 |
| 5,724,601 A * | 3/1998 | Kobayashi | H03K 5/1254 307/106 |
| 7,825,797 B2 * | 11/2010 | Zawde | G06F 3/03547 178/18.06 |
| 7,847,614 B2 * | 12/2010 | Taylor | H03K 5/1254 327/384 |
| 2011/0309956 A1 * | 12/2011 | Westhues | H03M 11/003 341/22 |
| 2012/0050208 A1 * | 3/2012 | Dietz | G06F 3/0416 345/174 |

* cited by examiner

*Primary Examiner* — Franklin D Balseca
(74) *Attorney, Agent, or Firm* — Winston Hsu

(57) ABSTRACT

An amending circuit of correcting bouncing misjudgment of a keyswitch includes a comparing unit, a predetermined voltage generating unit and a controlling unit. The comparing unit has a first input terminal, a second input terminal and an output terminal. The first input terminal is adapted to receive a triggering signal generated by the keyswitch. The predetermined voltage generating unit is electrically connected to the second input terminal and adapted to generate a first predetermined voltage. The controlling unit is electrically connected to the output terminal. The controlling unit is adapted to determine whether to execute polling application according to a comparison result of the comparing unit, and to generate a confirming signal while a polling result of the polling application is kept at a specific level. The confirming signal is used by an external processor to confirm that the keyswitch is actually triggered.

10 Claims, 3 Drawing Sheets

AMENDING CIRCUIT OF CORRECTING BOUNCING MISJUDGMENT OF A KEYSWITCH

BACKGROUND OF THE INVENTION

1. Field of the Invention

The present invention relates to an amending circuit, and more particularly, to an amending circuit of correcting bouncing misjudgment of a keyswitch.

2. Description of the Prior Art

The computer mouse has a left key and a right key, and the left key and the right key can be clicked by the user to generate control signals different from commands of a navigation module. The left key and the right key of the computer mouse respectively are an ordinary keyswitch mechanism, a keycap of the keyswitch is pressed downward to generate the control signal, and the keycap is moved back to an initial height by a recovering force of a resilient component. The resilient component is inevitably fatigued after frequent exercitation, the keycap easily bounces by environmental vibration without manual pressure, and the keyswitch of the computer mouse may be misjudged as being triggered. Conventional solution utilizes polling application to determine whether the keyswitch is actually triggered or accidently bounces; however, the long-term polling determination period results in non-fluency operation of the computer mouse, and the short-term polling determination period results in bouncing misjudgment of the keyswitch. Thus, design of an amending technique capable of decreasing the polling determination period and correcting the bouncing misjudgment is an important issue in the mechanical industry.

SUMMARY OF THE INVENTION

The present invention provides an amending circuit of correcting bouncing misjudgment of a keyswitch for solving above drawbacks.

According to the claimed invention, an amending circuit of correcting bouncing misjudgment of a keyswitch includes a comparing unit, a predetermined voltage generating unit and a controlling unit. The comparing unit has a first input terminal, a second input terminal and an output terminal. The first input terminal is adapted to receive a triggering signal generated by the keyswitch. The predetermined voltage generating unit is electrically connected to the second input terminal and adapted to generate a first predetermined voltage. The controlling unit is electrically connected to the output terminal. The controlling unit is adapted to determine whether to execute polling application according to a comparison result of the comparing unit, and to generate a confirming signal while a polling result of the polling application is kept at a specific level. The confirming signal is used to confirm the keyswitch being actually triggered by an external processor.

According to the claimed invention, the amending circuit further includes an edge triggering unit electrically connected to the first input terminal and the keyswitch and adapted to determine whether transition of the triggering signal is occurred. The comparing unit is actuated to determine whether the polling application is executed while electrical potential of the triggering signal is changed, and the controlling unit is further adapted to determines that the keyswitch is not actually triggered while the electrical potential of the triggering signal is not changed.

According to the claimed invention, the controlling unit is further adapted to execute the polling application while a voltage value of the triggering signal is higher than the first predetermined voltage, and to output a prompting signal while the voltage value is lower than or equal to the first predetermined voltage. The controlling unit is further adapted to determine that the keyswitch is not actually triggered while the voltage value is lower than or equal to the first predetermined voltage. The controlling unit is further adapted to record an accumulative quantity of the triggering signal having a voltage value lower than the first predetermined voltage, and to output a prompting signal in accordance with the accumulative quantity.

According to the claimed invention, the predetermined voltage generating unit is further adapted to generate a second predetermined voltage, the comparing unit compares the triggering signal with the second predetermined voltage to determine whether the keyswitch is actually triggered while electrical potential of the triggering signal is not changed. The controlling unit is further adapted to output a prompting signal while a voltage value of the triggering signal is higher than or equal to the second predetermined voltage.

According to the claimed invention, the controlling unit is further adapted to generate the confirming signal while the polling result is kept at the specific level during a predetermined period or within a predetermined amount. A length of the predetermined period or a number of the predetermined amount is varied in accordance with an operation frequency of the controlling unit.

The amending circuit of the present invention utilizes the high-frequency controlling unit to persistently and rapidly detect whether the keyswitch is actually triggered. The edge triggering unit of the amending circuit is used to detect transition of the triggering signal for determining whether to actuate the comparing unit. The comparing unit is used to execute comparison computation between the triggering signal of the keyswitch, the first predetermined voltage and the second predetermined voltage, and can accurately determine that the keyswitch is actually triggered by the user or accidently bounces due to mechanical misalignment in accordance with analysis of the number and/or time length of the triggering signal getting into the critical region. Therefore, the amending circuit of the present invention not only can utilize the high-frequency controlling unit to decrease the polling time, but also utilize the comparing unit and the edge triggering unit to execute the keyswitch triggering/bouncing determination, so as to avoid operation malfunction of the keyswitch-typed electronic apparatus by misjudgment.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
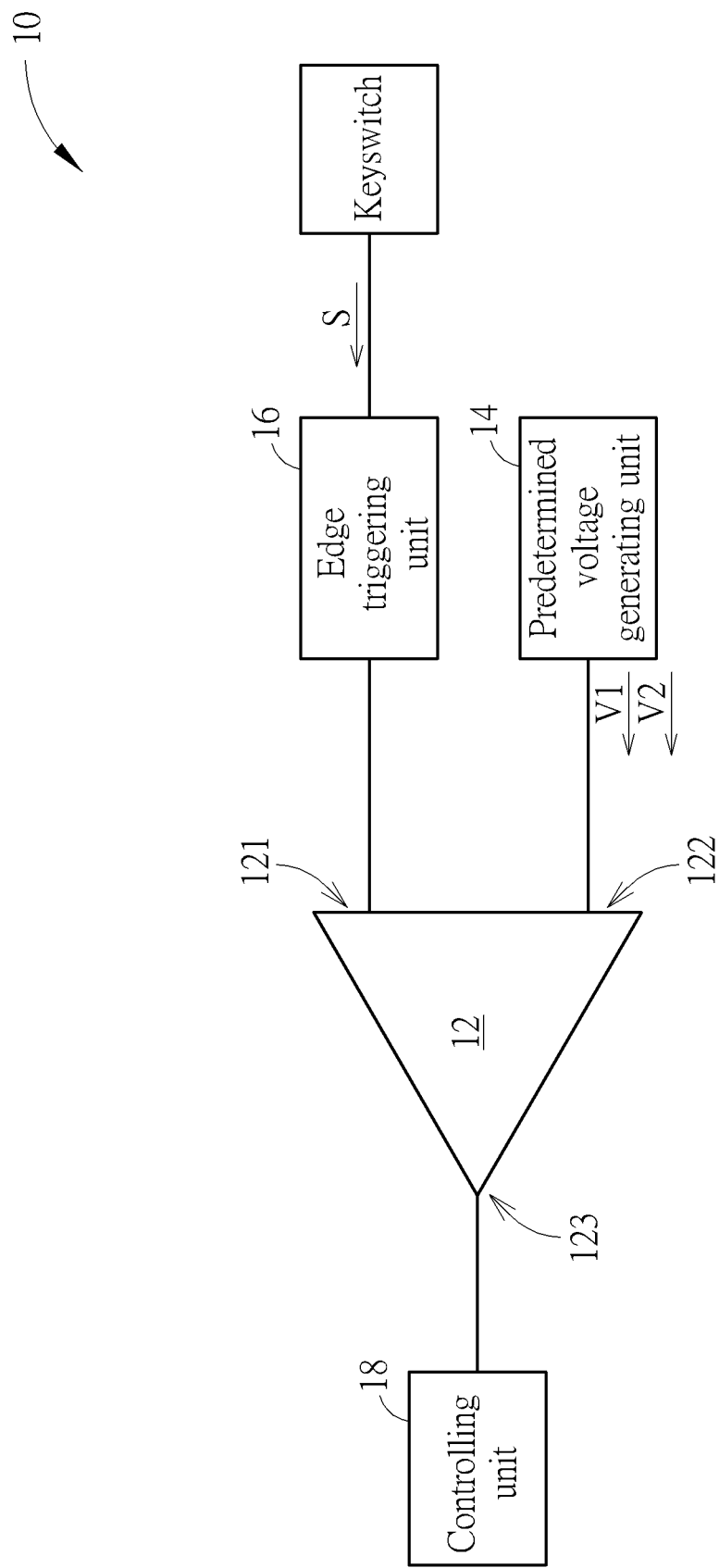
FIG. 1 is a circuit diagram of an amending circuit according to an embodiment of the present invention.
Figure 2:
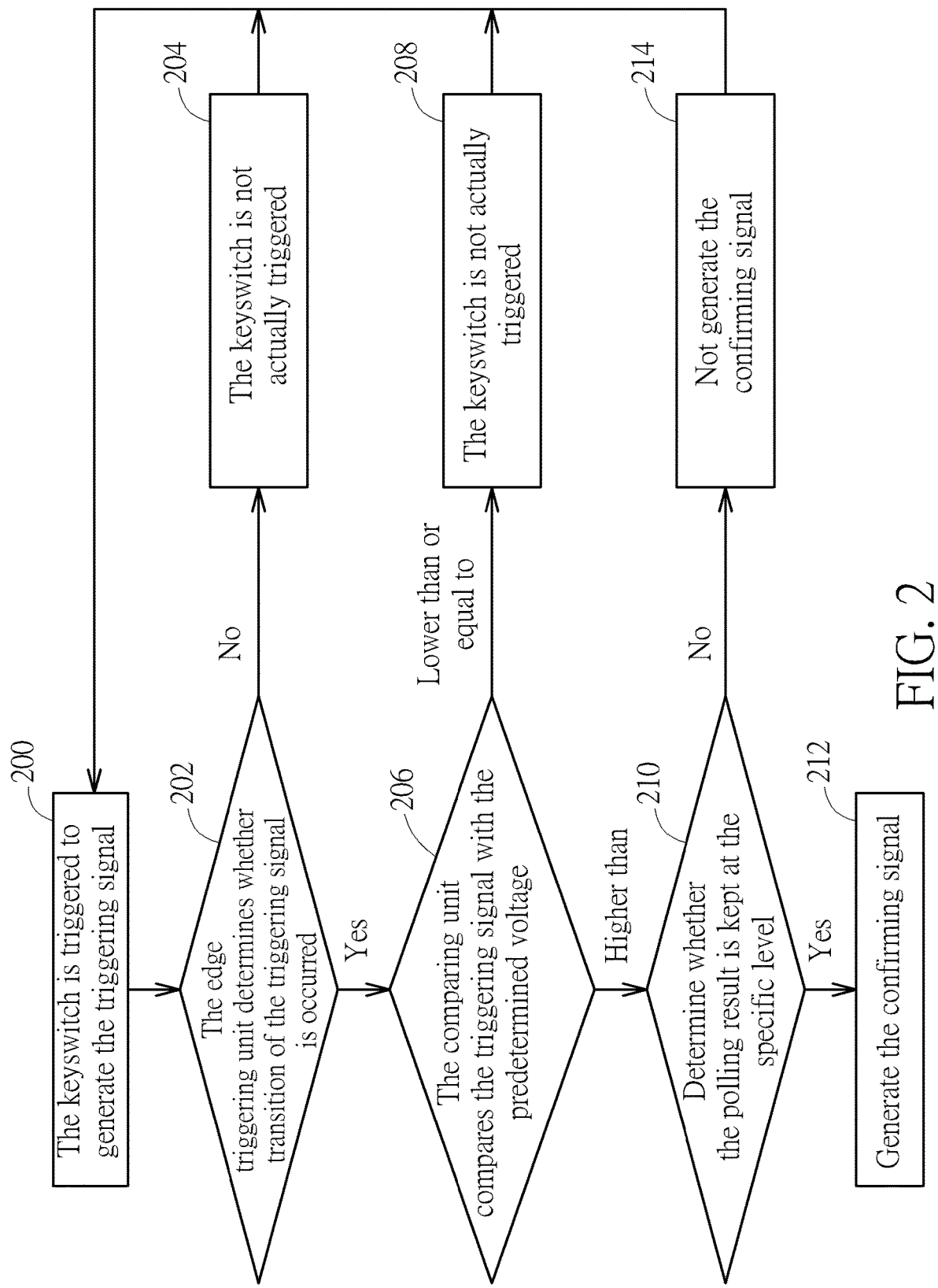
FIG. 2 is a flow chart of execution of the amending circuit according to the embodiment of the present invention.
Figure 3:
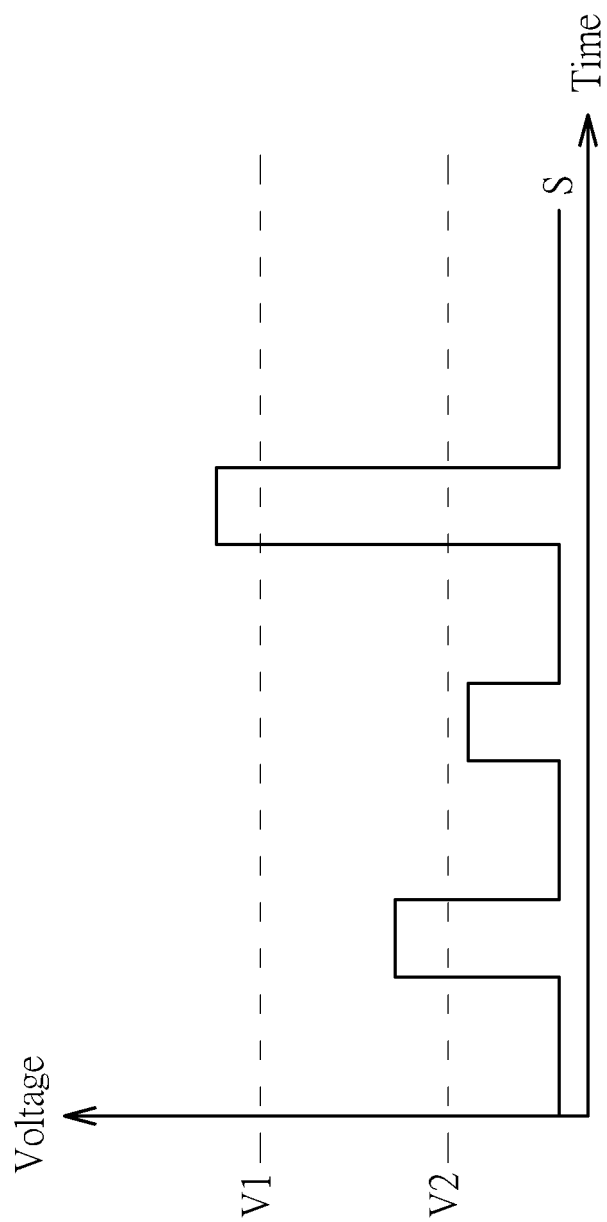
FIG. 3 is a wave diagram of a triggering signal analyzed by the amending circuit according to the embodiment of the present invention.

Please refer to FIG. 1 to FIG. 3. FIG. 1 is a circuit diagram of an amending circuit 10 according to an embodiment of the present invention. FIG. 2 is a flow chart of execution of the amending circuit 10 according to the embodiment of the present invention. FIG. 3 is a wave diagram of a triggering signal S analyzed by the amending circuit 10 according to the embodiment of the present invention. The amending circuit 10 is preferably applied to an electronic apparatus having a keyswitch to correct bouncing misjudgment of the keyswitch, for example, the said electronic apparatus can be a navigation device used as the computer mouse. The triggering signal S can be generated while the keyswitch is pressed by the user or is affected by environmental vibration. Variation of the triggering signal S formed by the keyswitch actually triggered is normally larger than variation of the triggering signal S generated by the bouncing keyswitch due to the environmental vibration. The amending circuit 10 of the present invention utilizes an edge triggering technique and a comparator detecting technique to analyze parameter property of the triggering signal S, so as to effectively determine whether the keyswitch is triggered by the user or bounces because of the environmental vibration.

As shown in FIG. 1, the amending circuit 10 includes a comparing unit 12, a predetermined voltage generating unit 14, an edge triggering unit 16 and a controlling unit 18. The edge triggering unit 16 is electrically connected to the keyswitch and a first input terminal 121 of the comparing unit 12, and can be further electrically connected to the controlling unit 18. The predetermined voltage generating unit 14 is electrically connected to a second input terminal 122 of the comparing unit 12, and the controlling unit 18 is electrically connected to an output terminal 123 of the comparing unit 12. It should be mentioned that the edge triggering unit 16 is a selective component, which can be disposed or removed according to the user's demand. While the amending circuit 10 does not have the edge triggering unit 16, the comparing unit 12 is continuously kept at an activated mode; while the amending circuit 10 has the edge triggering unit 16, the comparing unit 12 in the beginning can be set as a sleep mode for energy economy, and can be activated for analyzing the bouncing misjudgment of the keyswitch until the edge triggering unit 16 determines whether transition of the triggering signal S is occurred.

First, steps 200 and 202 are executed to generate a triggering signal S when the keyswitch is triggered, and the edge triggering unit 16 receives the triggering signal S and determines whether electrical potential of the triggering signal S is changed. While the electrical potential is not changed, step 204 is executed that the keyswitch is determined as not being actually triggered, and the comparing unit 12 is kept at the sleep mode. While the electrical potential of the triggering signal S is changed, step 206 is executed that the edge triggering unit 16 outputs an activating signal to awake the comparing unit 12, and the comparing unit 12 compares the triggering signal S with a first predetermined voltage V1 generated by the predetermined voltage generating unit 14. As if the amending circuit 10 does not have the edge triggering unit 16, the triggering signal S generated by the keyswitch is directly transmitted to the comparing unit 12 via the first input terminal 121, and then the comparing unit 12 executes comparison between the triggering signal S and the first predetermined voltage V1.

While a voltage value of the triggering signal S is lower than or equal to the first predetermined voltage V1, step 208 is executed and the controlling unit 18 determines the keyswitch is not actually triggered and may optionally output a prompting signal. The prompting signal is used to remind the user that the keyswitch is unable to exercise, or can be applied to any possible warning event. While the voltage value of the triggering signal S is higher than the first predetermined voltage V1, step 210 is executed to actuate polling application by the controlling unit 18. In step 208, the keyswitch may be defined as temporary invalid when an accumulative quantity of the triggering signal S having the voltage value lower than the first predetermined voltage V1 is less, when the accumulative quantity of the voltage value recorded by the controlling unit 18 lower than the first predetermined voltage V1 is increased, the keyswitch is defined as permanent invalid and the prompting signal is output accordingly.

After execution of the polling application, while a polling result can be kept at a specific level during a predetermined period (the predetermined period can be 1 millisecond, and an actual number is not limited to the above-mentioned value), step 212 is executed that the controlling unit 18 generates a confirming signal, the amending circuit 10 transmits the confirming signal to an electronic device cooperated with the keyswitch-typed electronic apparatus, and an external processor of the said electronic device can determine the keyswitch clicking signal generated from the keyswitch-typed electronic apparatus to execute a related application program when the keyswitch is actually triggered. While the polling result cannot be kept at the specific level during the predetermined period, step 214 is executed that the amending circuit 10 does not generate the confirming signal, the triggering signal is generated by an accident bounce of the keyswitch, and the keyswitch is determined as not being actually triggered.

In step 212, the controlling unit 18 preferably can generate the confirming signal while the polling result is kept at the specific level during the predetermined period or within a predetermined amount for preventing misjudgment of the polling application, and a length of the predetermined period or a number of the predetermined amount is varied in accordance with an operation frequency of the controlling unit 18. For example, the controlling unit 18 having the operation frequency set as 32 MHz can execute two hundred times keyswitch detection during the period of 3 milliseconds, and the two hundred times keyswitch detection can be completed under 1.3 millisecond while the operation frequency of the controlling unit 18 is set as 72 MHz Parameters of the predetermined period and the predetermined amount are not limited to the above-mentioned embodiments, which depends on design demand.

In addition, the predetermined voltage generating unit 14 may be utilized to generate a second predetermined voltage V2 different from the first predetermined voltage V1. As an example about the computer mouse, the first predetermined voltage V1 is set as three volts, the second predetermined voltage V2 is set as 0.3 volt, an interval between the first predetermined voltage V1 and the second predetermined voltage V2 can be defined as a critical region, and an actual application is not limited to the above-mentioned description. In step 202, the edge triggering unit 16 determines the electrical potential of the triggering signal S is not changed, and the comparing unit 12 can optionally compare the triggering signal S with the second predetermined voltage V2. While the voltage value of the triggering signal S gets into the critical region, which means the voltage value is lower than the first predetermined voltage V1 and higher than or equal to the second predetermined voltage V2, the controlling unit 18 determines the keyswitch is not actually triggered and outputs the prompting signal accordingly. As the embodiment mentioned above, the amending circuit 10 can remind the user that the keyswitch is permanent valid and in need of replacement according to the number and/or time length of the triggering signal S getting into the critical region.

In conclusion, the amending circuit of the present invention utilizes the high-frequency controlling unit to persistently and rapidly detect whether the keyswitch is actually triggered. The edge triggering unit of the amending circuit is used to detect transition of the triggering signal for determining whether to actuate the comparing unit. The comparing unit is used to execute comparison computation between the triggering signal of the keyswitch, the first predetermined voltage and the second predetermined voltage, and can accurately determine that the keyswitch is actually triggered by the user or accidently bounces due to mechanical misalignment in accordance with analysis of the number and/or time length of the triggering signal getting into the critical region. Therefore, the amending circuit of the present invention not only can utilize the high-frequency controlling unit to decrease the polling time, but also utilize the comparing unit and the edge triggering unit to execute the keyswitch triggering/bouncing determination, so as to avoid operation malfunction of the keyswitch-typed electronic apparatus by misjudgment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amending circuit for correcting bouncing misjudgment of a keyswitch, the amending circuit comprising:
    a comparator having a first input terminal, a second input terminal and an output terminal, the first input terminal being adapted to receive a plurality of triggering signals generated by the keyswitch;
    a predetermined voltage generator electrically connected to the second input terminal and adapted to generate a first predetermined voltage and a second predetermined voltage, the first predetermined voltage being larger than the second predetermined voltage, and a critical region being defined between the first predetermined voltage and the second predetermined voltage; and
    a controller electrically connected to the output terminal, the controller being adapted to determine the triggering signals are generated by an actual triggering of the keyswitch when the triggering signals are higher than the critical region and further determine the keyswitch is bounced when the triggering signals are at the critical region and further determine the keyswitch is not triggered when the triggering signals are lower than the critical region, and to generate a confirming signal according to variation in an operation frequency of a polling application while a polling result of the polling application is kept at a specific level, wherein the confirming signal is used by an external processor to perform a function related to the keyswitch, variation of the triggering signals generated by the actual triggering of the keyswitch is larger than variation of the triggering signals generated by bouncing of the keyswitch due to environmental vibration.

2. The amending circuit of claim 1, further comprising:
    an edge trigger electrically connected to the first input terminal and the keyswitch and adapted to determine whether transition of at least one triggering signal of the plurality of triggering signals has occurred.

3. The amending circuit of claim 2, wherein the comparator is actuated to determine whether the polling application is actuated while electrical potential of the at least one triggering signal is changed, and the controller is further adapted to determine that the keyswitch is not actually triggered while the electrical potential of the at least one triggering signal is not changed.

4. The amending circuit of claim 1, wherein the controller is further adapted to actuate the polling application while a voltage value of at least one triggering signal of the plurality of triggering signals is higher than the first predetermined voltage, and to output a prompting signal while the voltage value is lower than or equal to the first predetermined voltage.

5. The amending circuit of claim 4, wherein the controller is further adapted to determine that the keyswitch is not actually triggered while the voltage value is lower than or equal to the first predetermined voltage.

6. The amending circuit of claim 1, wherein the controller is further adapted to record an accumulative quantity of some of the plurality of triggering signals having a voltage value lower than the first predetermined voltage, and to output a prompting signal in accordance with the accumulative quantity.

7. The amending circuit of claim 2, wherein the predetermined voltage generator is further adapted to generate a second predetermined voltage, the comparator compares the at least one triggering signal with the second predetermined voltage to determine whether the keyswitch is actually triggered while electrical potential of the at least one triggering signal is not changed.

8. The amending circuit of claim 7, wherein the controller is further adapted to output a prompting signal while a voltage value of the at least one triggering signal is higher than or equal to the second predetermined voltage.

9. The amending circuit of claim 1, wherein the controller is further adapted to generate the confirming signal while the polling result is kept at the specific level during a predetermined period or within a predetermined amount.

10. The amending circuit of claim 9, wherein a length of the predetermined period or a number of the predetermined amount is varied in accordance with an operation frequency of the controller.

* * * * *